United States Patent
Tang

(10) Patent No.: US 11,133,038 B1
(45) Date of Patent: Sep. 28, 2021

(54) MULTI-DIE PEAK POWER MANAGEMENT FOR THREE-DIMENSIONAL MEMORY

(71) Applicant: Yangtze Memory Technologies Co., Ltd., Hubei (CN)

(72) Inventor: Qiang Tang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/014,451

(22) Filed: Sep. 8, 2020

Related U.S. Application Data

(63) Continuation of application No. PCT/CN2020/107294, filed on Aug. 6, 2020.

(51) Int. Cl.
  *G11C 5/14* (2006.01)
  *H01L 27/06* (2006.01)
  *H01L 23/00* (2006.01)

(52) U.S. Cl.
  CPC ............ *G11C 5/14* (2013.01); *H01L 27/0629* (2013.01); *H01L 24/45* (2013.01); *H01L 2924/1434* (2013.01)

(58) Field of Classification Search
  CPC ....... G11C 5/14; H01L 27/0629; H01L 24/45; H01L 2924/1434
  USPC ............................................. 365/189.04, 226
  See application file for complete search history.

(56) References Cited

U.S. PATENT DOCUMENTS

| | | | | |
|---|---|---|---|---|
| 2006/0091901 A1* | 5/2006 | Kim | ..................... | G11C 7/1051 326/30 |
| 2010/0020628 A1* | 1/2010 | Sugiura | ..................... | G11C 5/02 365/226 |
| 2010/0246152 A1* | 9/2010 | Lin | ......................... | H01L 24/92 361/783 |
| 2011/0320686 A1* | 12/2011 | Cheng | ................. | G06F 13/4086 711/103 |
| 2013/0002301 A1 | 1/2013 | Gondi et al. | | |
| 2013/0027081 A1* | 1/2013 | Nazarian | .......... | H03K 19/17758 326/44 |

(Continued)

OTHER PUBLICATIONS

International Search Report of the International Searching Authority directed to related International Patent Application No. PCT/CN2020/107294, dated Apr. 29, 2021; 5 pages.

(Continued)

*Primary Examiner* — Michael T Tran
(74) *Attorney, Agent, or Firm* — Sterne, Kessler, Goldstein & Fox P.L.L.C.

(57) ABSTRACT

Embodiments of a peak power management (PPM) circuit on a memory die are disclosed. The PPM circuit includes a first transistor and a second transistor arranged in parallel, wherein the first and second transistors each has a drain terminal electrically connected to a first power source and a second power source, respectively. The PPM circuit also includes a resistor having a first terminal electrically connected to respective source terminals of the first and second transistors. The PPM circuit further includes a first contact pad on the memory die, electrically connected to a second contact pad on a different memory die through a die-to-die connection. The PPM circuit also includes a third transistor with a drain terminal electrically connected to a second terminal of the resistor, and a source terminal electrically connected to the first contact pad.

20 Claims, 5 Drawing Sheets

(56) References Cited

U.S. PATENT DOCUMENTS

| | | | | |
|---|---|---|---|---|
| 2013/0320955 A1* | 12/2013 | Kratyuk | ................. | G05F 3/242 |
| | | | | 323/313 |
| 2014/0313812 A1* | 10/2014 | Yim | .................... | G11C 11/1675 |
| | | | | 365/148 |
| 2016/0035677 A1* | 2/2016 | Wachter | .............. | H01L 21/6835 |
| | | | | 257/659 |
| 2016/0070277 A1* | 3/2016 | Price | ....................... | H01L 22/30 |
| | | | | 324/123 R |
| 2016/0276265 A1* | 9/2016 | Iwabuchi | ............ | H01L 27/0248 |
| 2019/0173463 A1 | 6/2019 | Mori | | |
| 2019/0252020 A1* | 8/2019 | Rios | ...................... | H01L 45/147 |
| 2020/0043534 A1* | 2/2020 | Katoch | ................ | G11C 7/1087 |

OTHER PUBLICATIONS

Taiwanese Application No. 11020695010, office Action dated Jul. 20, 2021; 7 pages.

\* cited by examiner

MULTI-DIE PEAK POWER MANAGEMENT FOR THREE-DIMENSIONAL MEMORY

CROSS-REFERENCE TO RELATED APPLICATIONS AND INCORPORATION BY REFERENCE

This application claims priority to PCT/CN2020/107294 filed on Aug. 6, 2020, which is incorporated herein by reference in its entirety.

TECHNICAL FIELD

The present disclosure generally relates to the field of semiconductor technology, and more particularly, to circuit designs and methods for peak power management in a storage system.

BACKGROUND

In many servers and mobile devices, NAND storage system is widely used as the primary non-volatile storage device due to its high storage density and relatively low access latency. However, performance of a high density storage system, for example, a three-dimensional (3D) NAND storage system, is often restricted by the maximum amount of power that it can use. Currently, operations consuming high power (i.e., peak power operations) that are carried out by various memory dies of the NAND storage system, can be staggered through a system controller. Only a limited number of peak power operations can be performed simultaneously. This approach can result in increased system loading. Communications between different memory dies can be established to coordinate the peak power operations. However, these communications may rely on complicated control circuits that require multiple contact pads on each memory die. Therefore, it is necessary to optimize the control circuits for peak power operations and reduce the number of contact pads on each memory die.

BRIEF SUMMARY

An object of the present disclosure is to provide effective peak power management for a memory storage system. The peak power management (PPM) circuits according to the present disclosure can control the number and timing of memory dies performing peak power operations. Through a single contact pad on each memory die, die-to-die communications can be established for the PPM circuits at reduced cost. In the meantime, the PPM method provided in the present disclosure can be easily implemented. Performance of the NAND storage system can be optimized by balancing multi-die operations and power consumptions.

One aspect of the present disclosure provides a peak power management (PPM) circuit on a memory die. The PPM circuit includes a first transistor and a second transistor arranged in parallel, wherein the first and second transistors each has a drain terminal electrically connected to a first power source and a second power source, respectively. The PPM circuit also includes a resistor having a first terminal electrically connected to respective source terminals of the first and second transistors. The PPM circuit further includes a first contact pad on the memory die, electrically connected to a second contact pad on a different memory die through a die-to-die connection. The PPM circuit also includes a third transistor with a drain terminal electrically connected to a second terminal of the resistor, and a source terminal electrically connected to the first contact pad.

In some embodiments, the PPM circuit further includes an amplifier with an input terminal electrically connected to the drain terminal of the third transistor. In some embodiments, the amplifier is a comparator.

In some embodiments, the first and second transistors are p-channel metal oxide semiconductor field effect transistors (MOSFETs).

In some embodiments, the third transistor is an n-channel metal oxide semiconductor field effect transistor (MOSFET).

In some embodiments, the PPM circuit further includes a current source configured to control a peak power operation device on the memory die based on a pull-down current flowing through the current source.

In some embodiments, the PPM circuit also includes a fourth transistor electrically connected with the current source and the first contact pad.

In some embodiments, the first contact pad is electrically connected to the second contact pad on the different memory die through wire-bonding, the die-to-die connection having a metal wire.

In some embodiments, the first contact pad is electrically connected to the second contact pad on the different memory die through flip-chip bonding or die-to-die bonding, the die-to-die connection having a metal or conductive material.

Another aspect of the present disclosure provides a method of peak power management (PPM) for a memory chip with one or more memory dies, where each of the one or more memory dies includes a peak power management (PPM) circuit. The method of PPM includes performing a first stage of management on a selected memory die in the memory chip, and performing a second stage of management on the selected memory die. Performing the first stage of management includes comparing a potential of a contact pad in the PPM circuit with a first predetermined voltage, wherein the contact pad is electrically connected with a second contact pad of a different memory die. Performing the first stage of management also includes setting a pull-down current of a current source, which is electrically connected to the contact pad in the PPM circuit, to an estimated peak power current corresponding to a peak power operation on the selected memory die when the potential of the contact pad is higher than the first predetermined voltage. Performing the second stage of management includes comparing the potential of the contact pad with a second predetermined voltage lower than the first predetermined voltage, and comparing a total current flowing through a resistor, which is electrically connected to the contact pad in the PPM circuit, with a maximum current allowed on the selected memory die when the potential of the contact pad is lower than the second predetermined voltage. Performing the second stage of management further includes performing the peak power operation on the selected memory die when the total current is less than the maximum current.

In some embodiments, the method of PPM also includes adding a time delay between performing the first stage of management and performing the second stage of management, wherein the time delay is different for different memory die.

In some embodiments, the method of PPM further includes repeating the comparing of the potential of the contact pad with the second predetermined voltage when the potential of the contact pad is not lower than the second predetermined voltage.

In some embodiments, performing the second stage of management also includes setting the pull-down current of the current source to an idle current when the total current is not less than the maximum current.

In some embodiments, the method of PPM also includes checking a rising edge of the potential of the contact pad, and repeating the checking of the rising edge of the potential of the contact pad if the rising edge of the potential of the contact pad is not detected or a predetermined maximum time is not reached.

In some embodiments, the method of PPM, further includes adding a second time delay when the rising edge of the potential of the contact pad is detected or the predetermined maximum time is reached, wherein the second time delay is different for each of the one or more memory dies.

In some embodiments, performing the first stage of management further includes comparing the potential of the contact pad with the second predetermined voltage when the potential of the contact pad is not higher than the first predetermined voltage.

In some embodiments, the method of PPM further includes comparing the total current with the maximum current subtracting the estimated peak power current if the potential of the contact pad is lower than the second predetermined voltage.

In some embodiments, the method of PPM further includes comparing the potential of the contact pad with the first predetermined voltage when the rising edge of the potential of the contact pad is detected or the predetermined maximum time is reached.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
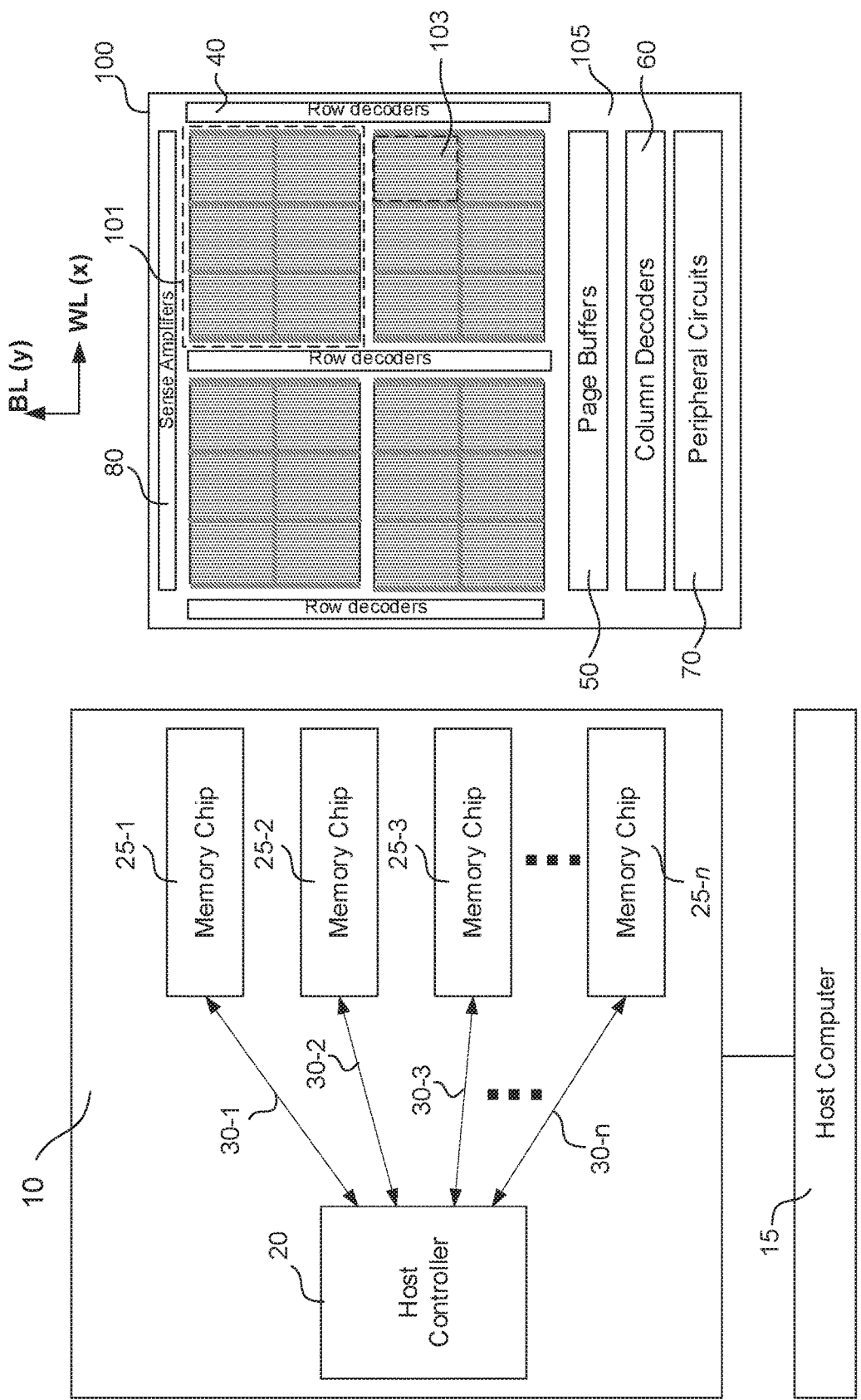
FIG. 1A illustrates a storage system with one or more memory chips, according to some embodiments of the present disclosure.
FIG. 1B illustrates a top-down view of a memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1A illustrates a storage system 10, according to some embodiments of the present disclosure. The storage system 10 (also referred to as a NAND storage system or a solid state drive) can include a host controller 20 and one or more memory chips 25-1, 25-2, 25-3, . . . , 25-n. Each memory chip 25 can be a NAND chip (i.e., "flash," "NAND flash" or "NAND"). The solid state drive (SSD) 10 can communicate with a host computer 15 through the host controller 20, where the host controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the host controller 20 via a memory channel 30.

The host computer 15 sends data to be stored at the NAND storage system or SSD 10 or retrieves data by reading the SSD 10. The host controller 20 can handle I/O requests received from the host computer 15, ensure data integrity and efficient storage, and manage the memory chip 25. The memory channels 30 can provide data and control communication between the host controller 20 and each memory chip 25 via a data bus. The host controller 20 can select one of the memory chip 25 according to a chip enable signal.

FIG. 1B illustrates a top-down view of a NAND flash memory 100, according to some embodiments of the present disclosure. The NAND flash memory 100 can be a memory die (or a die) or any portion of a memory die. In some embodiments, each memory chip 25 in FIG. 1A can include one or more memory dies, e.g., one or more NAND flash memories 100. In some embodiments, each NAND flash memory 100 can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1B, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1B. In this disclosure, the memory block 103 is also referred to as the "memory array" or "array." The memory array is the core area on a memory die, performing storage functions.

The NAND flash memory 100 also includes a periphery region 105, an area surrounding memory planes 101. The periphery region 105 contains many digital, analog, and/or mixed-signal circuits to support functions of the memory array, for example, page buffers 50, row decoders 40, column decoders 60, peripheral circuits 70 and sense amplifiers 80. Peripheral circuits 70 include active and/or passive semiconductor devices, such as transistors, diodes, capacitors, resistors, etc., as would be apparent to a person of ordinary skill in the art.

It is noted that the layout of the electronic components in the SSD 10 and the NAND flash memory 100 in FIGS. 1A and 1B are shown as examples. The SSD 10 and the NAND flash memory 100 can have other layout and can include additional components. For example, the NAND flash memory 100 can also have high-voltage charge pumps, I/O circuits, etc. The SSD 10 can also include firmware, data scrambler, etc.

Figure 2:
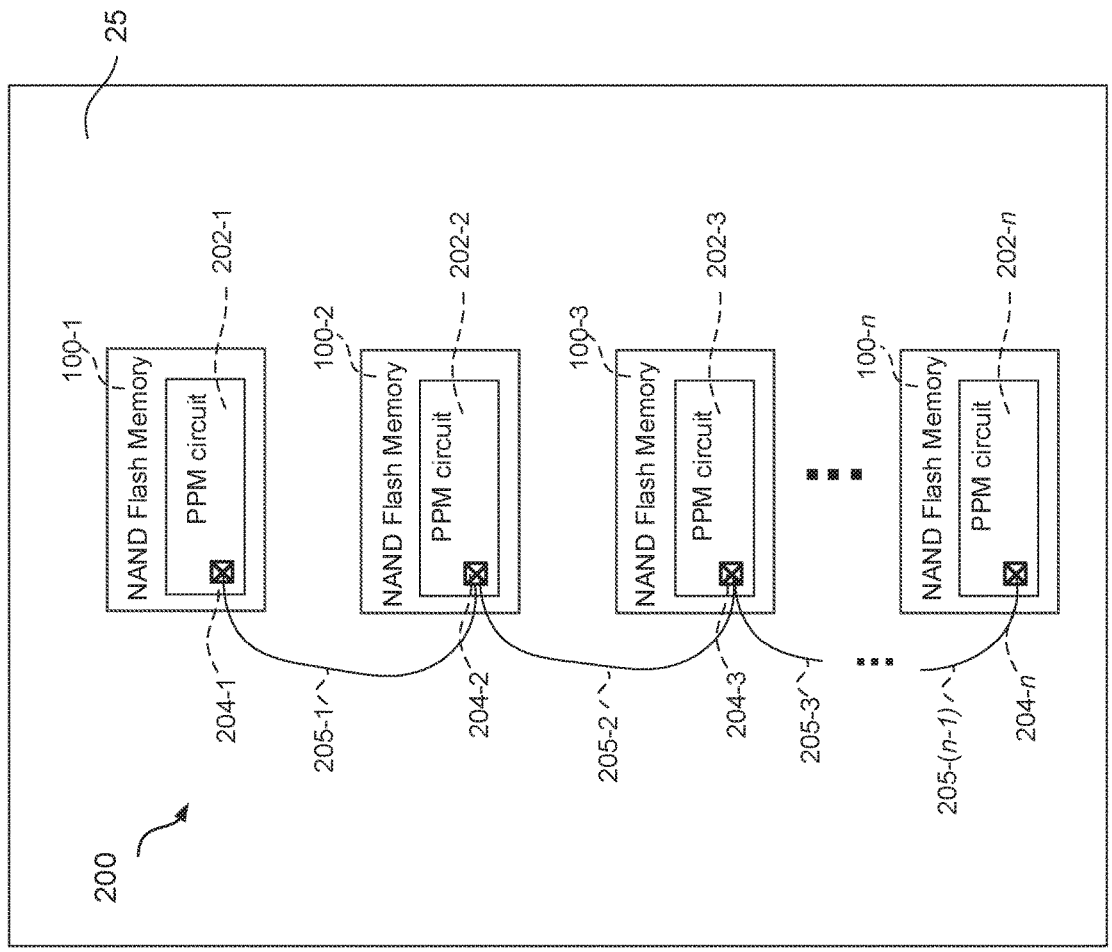
FIG. 2 illustrates a peak power management system in a memory chip, according to some embodiments of the present disclosure.

FIG. 2 illustrates a peak power management system 200 of the memory chip 25, according to some embodiments of the present disclosure. The peak power management (PPM) system 200 can be implemented in each memory chip 25 of the NAND storage system 10 in FIG. 1A, where each memory chip 25 can include a plurality of memory dies 100-1, 100-2, 100-3, . . . , 100-n, and each memory die can be similar to the NAND flash memory 100 discussed previously in reference with FIG. 1B. In some embodiments, each NAND flash memory 100 can include a peak power management (PPM) circuit 202, where each PPM circuit 202 can include a contact pad 204. The PPM circuits 202-1, 202-2, 202-3, . . . , 202-n on different NAND flash memories 100-1, 100-2, 100-3, . . . , 100-n can communicate with each other through the contact pads 204-1, 204-2, 204-3, . . . , 204-n. In some embodiments, the contact pads 204 between different NAND flash memories 100 can be electrically connected with each other through a plurality of die-to-die connections 205. In some embodiments, the die-to-die connection 205 between two contact pads 204 can be a metal wire formed through wire-bonding. In some embodiments, the die-to-die connection 205 can be a metal wire, any suitable metal or conductive material formed through flip-chip bonding or any suitable die-to-die bonding.

In some embodiments, the PPM circuit 202 of each NAND flash memory 100 can communicate with the PPM circuit of two other NAND flash memories through the die-to-die connections 205 and the contact pads 204. For example, the PPM circuit 202-2 can communicate with the PPM circuit 202-1 through the die-to-die connection 205-1 between the contact pads 204-2 and 204-1, and can communicate with the PPM circuit 202-3 through the die-to-die connection 205-2 between the contact pads 204-2 and 204-3. By using the die-to-die connections 205 described above, communications between different memory dies (i.e., NAND flash memories 100-1, 100-2, 100-3, . . . , 100-n) can be established in the memory chip 25 and the NAND storage system 10 can send operation commands to any number of memory dies at any time while the PPM circuits 202 can control the system power consumption by selecting one or a limited number of memory dies. In some embodiments, through implementing the PPM circuit 202 on each memory die, the NAND storage system 10 can resolve the power clamping issue by avoiding two or more memory dies operating in the peak power mode at the same time.

Figure 3:
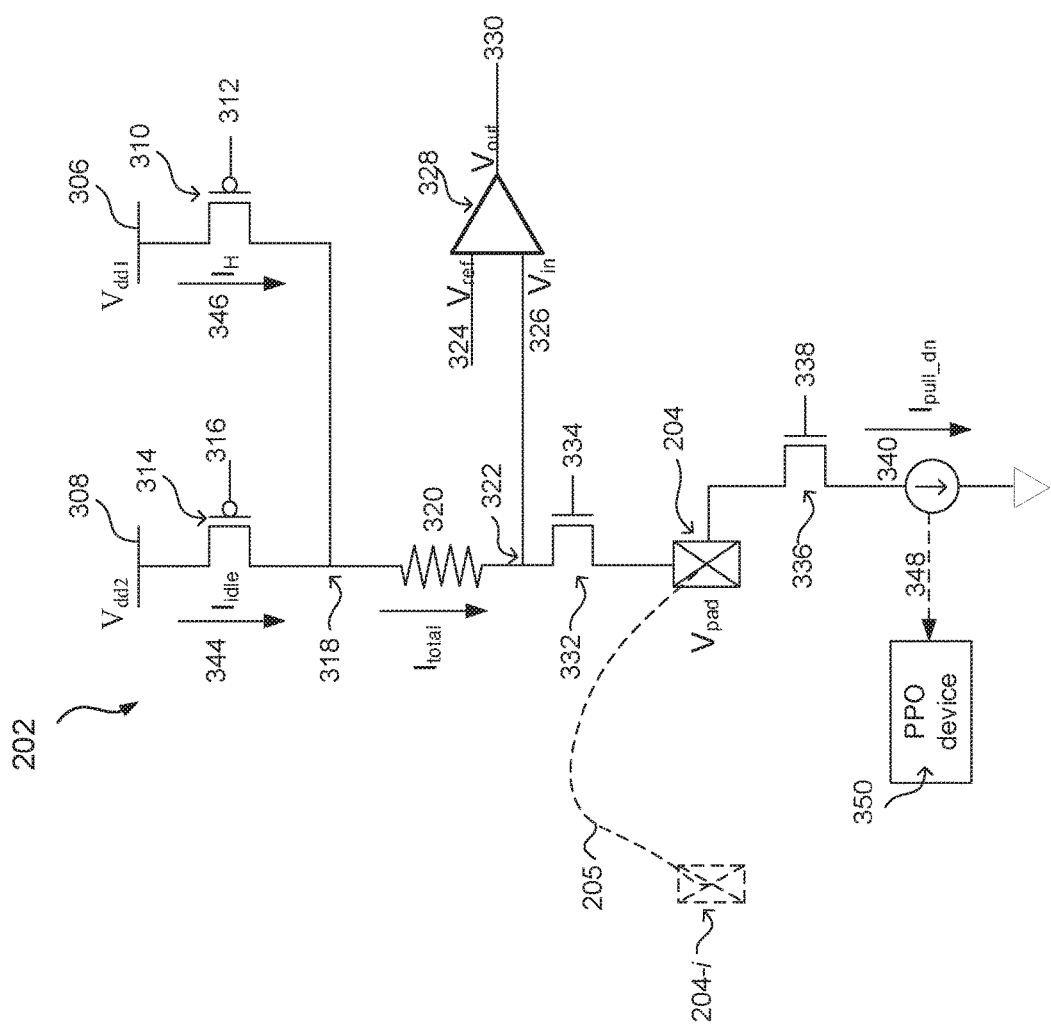
FIG. 3 illustrates a peak power management circuit, according to some embodiments of the present disclosure.

FIG. 3 illustrates an example of the PPM circuit 202, according to some embodiments of the present disclosure. The PPM circuit 202 can include a first power source ($V_{dd1}$) 306 and a second power source ($V_{dd2}$) 308 connected with drain terminals of a first transistor 310 and a second transistor 314, respectively. In some embodiments, the first and second transistors 310 and 312 can be metal-oxide-semi-conductor-field-effect-transistors (MOSFETs). In some embodiments, the first and second transistors 310 and 312 can be p-channel MOSFETs. Source terminals of the first and second transistors 310 and 314 can be connected at a node 318. In the other words, the first and second transistors 310 and 314 can be arranged in parallel.

The PPM circuit 202 also includes a resistor 320 having a resistance R. In one example, the resistance R of the resistor 320 can be about 5K ohm. One end of the resistor 320 can be connected to the source terminals of the first and second transistors 310 and 314 at the node 318. The other end of the resistor 320 can be connected to a drain terminal of a third transistor 332 at a node 322. A source terminal of the third transistor 332 can be connected to the contact pad 204, where the contact pad 204 can be connected to a drain terminal of a fourth transistor 336. The contact pad 204 on the present memory die can also be connected with another contact pad (e.g., contact pad 204-i) located on another memory die. As described previously with reference to FIG. 2, all the contact pads 204 can be electrically connected through die-to-die connections 205. Thus, all the contact pads of the memory dies in a memory chip can be held at the same electrical potential.

In some embodiments, the third and fourth transistors 332 and 336 can be MOSFETs. In some embodiments, the third and fourth transistors 332 and 336 can be n-channel MOSFETs. A source terminal of the fourth transistor 336 can be connected to a current source 340. By controlling a gate terminal 338 of the fourth transistor 336, a current path from the contact pad 204 to the current source 340 can be switched on or off. In some embodiments, the current source 340 can be a current-controlled device or circuit in the NAND flash memory 100, where any device or circuit that uses peak power, for example, a peak power operation (PPO) device 350, can be switch on or off through a control signal 348 sent from current source 340.

In some embodiments, the control signal 348 can be generated based on a magnitude of current flowing through the current source 340 (i.e., pull-down current $I_{pull\_dn}$). In some embodiments, the pull-down current $I_{pull\_dn}$ an can be proportional to the peak power needed by the PPO device 350. In this example, the pull-down current $I_{pull\_dn}$ an can be scaled down from a current needed by the PPO device 350 performing peak power operations. For example, if the PPO device 350 needs 200 mA current to perform a peak power operation, the pull-down current $I_{pull\_dn}$ an can be 20 µA. The peak power operations can be regulated on each memory die accordingly. Furthermore, through the die-to-die connection 205 at the contact pad 204, peak power operations throughout the entire memory chip 25 can be coordinated between different memory dies.

In some embodiments, the PPM circuit 202 can also include an amplifier 328, with a first input terminal 324 at a reference voltage $V_{ref}$ and a second input terminal 326 connected to the node 322 with an input voltage $V_{in}$. In some embodiments, the amplifier 328 can be an operational amplifier, for example, a comparator that can compare the input voltage $V_{in}$ with the reference voltage $V_{ref}$, where an output voltage $V_{out}$ at an output terminal 330 can indicate whether the input voltage yin is above or below the reference voltage $V_{ref}$. For example, the output voltage $V_{out}$ can be a positive voltage when the input voltage yin is larger than the reference voltage $V_{ref}$. On the other hand, the output voltage $V_{out}$ can be a negative voltage when the input voltage yin is smaller than the reference voltage $V_{ref}$.

In some embodiments, the PPM circuit 202 can have a first current path 344 from the second power source $V_{dd2}$ 308 through the second transistor 314. Current flowing through the second transistor 314 can be controlled by applying a bias on a gate terminal 316 of the second transistor 314. In one example, the second transistor 314 can be slightly turned on with an idle current $I_{idle}$. In some embodiments, the idle current $I_{idle}$ can be about 0.1 µA.

In some embodiments, the PPM circuit 202 includes a second current path 346 from the first power source $V_{dd1}$ 306 through the first transistor 310. Similarly, current flowing through the first transistor 310 can be controlled by applying a bias on a gate terminal 312 of the first transistor 310. In some embodiments, the gate terminal 312 can be applied with a voltage to fully turn on the first transistor 310, e.g., operating in the saturation mode. In one example, the first transistor 310 can be strongly turned on with a high level of current $I_H$. In some embodiments, the second current path 346 and the first transistor 310 can be turned on to detect the current flowing through the contact pad 204. In this example, a total current $I_{total}$ flowing through the resistor 320 is the sum of the idle current $I_{idle}$ and the high level of current $I_H$, i.e., $I_{total}=I_{idle}+I_H$, where the high level of current $I_H$ is higher than the idle current $I_{idle}$. In some embodiments, the high level of current $I_H$ can be at least one order of magnitude (~10×) higher than the idle current $I_{idle}$, i.e., $I_H \gg I_{idle}$. When the second current path 346 and the first transistor 310 are switched off, the total current $I_{total}$ flowing through the resistor 320 is about the same as the idle current $I_{idle}$, i.e., $I_{total}=I_{idle}$. The first current path 344 and the idle current $I_{idle}$ can be kept on in the PPM circuit 202 such that at a reset state the contact pad 204 can be maintained at certain electrical potential instead of floating.

In some embodiments, the third transistor 332 can clamp a potential $V_{pad}$ of the contact pad 204 to a pre-given potential $V_0$ when the first transistor 310 and the second current path 346 are turned on. For example, a potential of the source terminal of the third transistor 332 can follow an external bias applied on a gate terminal 334 of the third transistor 332. In this example, the third transistor 332 is implemented in a source follower configuration. The potential $V_{pad}$ of contact pad 204 can be the same as the potential of source terminal of the third transistor 332. In one example, the pre-given potential $V_0$ can be about 0.4 V. When the first transistor 310 and the second current path 346 are turned on for detecting the current flowing through the contact pad 204, the potential $V_{pad}$ of contact pad 204 can be clamped at the pre-given potential $V_0$.

Figure 4:
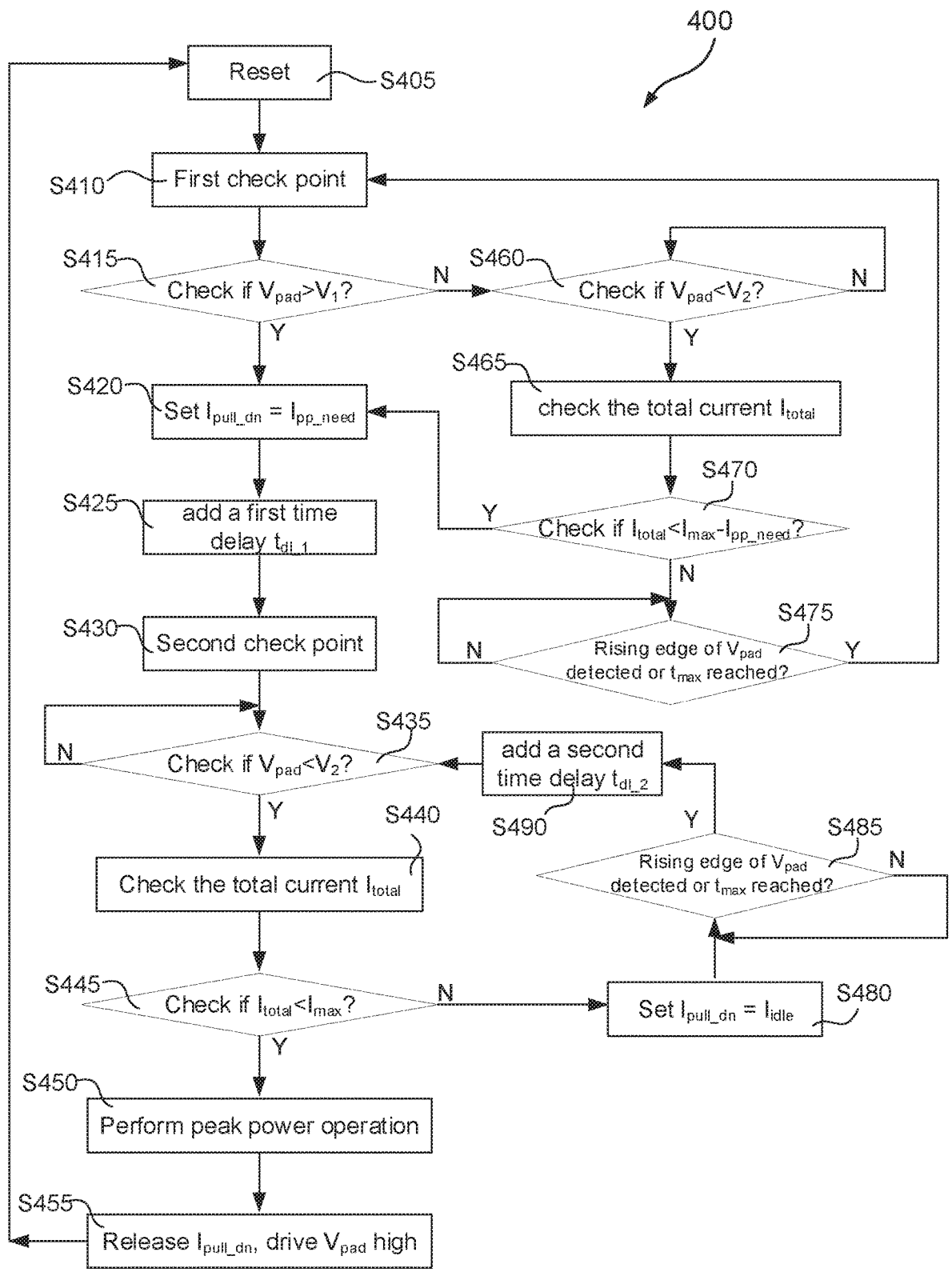
FIG. 4 illustrates a peak power check routine associated with the peak power management system and the peak power circuit in FIGS. 2 and 3, according to some embodiments of the present disclosure.

FIG. 4 illustrates a peak power check routine 400 associated with the peak power management system 200 and the PPM circuit 202 shown in FIGS. 2 and 3, according to some embodiments of the present disclosure. It should be understood that the peak power check routine 400 are not exhaustive and that other operation steps can be performed as well before, after, or between any of the illustrated operation steps. In some embodiments, some operation steps of the peak power check routine 400 can be omitted or other operation steps can be included, which are not described here for simplicity. In some embodiments, operation steps of the peak power check routine 400 can be performed in a different order and/or vary.

The peak power check (PPC) routine 400 provides an exemplary method of managing peak power usage for a memory chip with one or more memory dies. The example below is shown for the PPM circuit on a selected memory die, for example, the PPM circuit 202-2 of the NAND flash memory 100-2 in FIG. 3. However, the method can be extended to the PPM circuit 202 of each memory die in the memory chip.

Referring to FIGS. 3 and 4, the peak power check routine 400 starts at operation step S405, where the PPM circuit 202 of a selected memory die is at a reset state. At the reset state, the first transistor 310 and the second current path 346 are switched off. Only the idle current $I_{idle}$ flows through the resistor 320. The pull-down current $I_{pull\_dn}$ flowing through the current source 340 is about the same as the idle current $I_{idle}$.

At operation step S410, the PPC routine 400 enters the first check point (or first stage of management).

At operation step S415, the potential $V_{pad}$ of contact pad 204 is compared with a first predetermined voltage $V_1$. In one example, the first predetermined voltage $V_1$ can be about 0.5 V. The comparison of the potential $V_{pad}$ and the first predetermined voltage $V_1$ can be performed by using an amplifier, similar to the amplifier 328 in FIG. 3 as described previously.

If the potential $V_{pad}$ is higher than the first predetermined voltage $V_1$, the pull-down current $I_{pull\_dn}$ an at the current source 340 or the total current $I_{total}$ flowing through the resistor 320 can be low, for example, lower than an estimated peak power current $I_{pp\_need}$ associated with the peak power needed by the PPO device 350. Furthermore, there can be no peak power operation performed at any memory die in the same memory chip because all the contact pads 204 can be held at the same electric potential through the die-to-die connections 205.

The PPC routine 400 moves to operation step S420 when $V_{pad} > V_1$. The estimated peak power current $I_{pp\_need}$ can be set as the pull-down current $I_{pull\_dn}$ an at the current source 340. After adding a first time delay $t_{dl\_1}$ at operation step S425, the PPC routine 400 enters the second check point (or second stage of management) at operation step S430. In some embodiments, the first time delay $t_{dl\_1}$ of each memory die can be different. Implementing different first time delay $t_{dl\_1}$ between different memory dies, the PPM system 200 can avoid peak power operations performed simultaneously in two or more memory dies in a memory chip.

If at operation step S415 the potential $V_{pad}$ is not larger than the first predetermined voltage $V_1$, i.e., $V_{pad} \leq V_1$, there can be peak power operation performed by one of the memory dies (different from the selected memory die) such that the potential $V_{pad}$ of contact pad 204 is pulled down from the first predetermined voltage $V_1$ through the die-to-die connection 205.

At operation step S460, the potential $V_{pad}$ can be compared with a second predetermined voltage $V_2$ that is smaller than the first predetermined voltage $V_1$. In one example, the second predetermined voltage $V_2$ can be around 0.2 V. The comparison of the potential $V_{pad}$ and the second predetermined voltage $V_2$ can be performed by using an amplifier, similar to the amplifier 328 in FIG. 3 as described previously.

If $V_{pad} \leq V_1$, but $V_{pad} \geq V_2$, the PPC routine 400 repeats the comparison of $V_{pad}$ and $V_2$. If $V_{pad} < V_2$, then operation step S465 can be performed, where the total current $I_{total}$ flowing through the resistor 320 can be checked or detected.

If $V_{pad} < V_2$, it is indicated that other memory die is not running the PPC routine 400 and checking the total current $I_{total}$. Therefore the present memory die can run operation step S465 to check the total current $I_{total}$.

Figure 5:
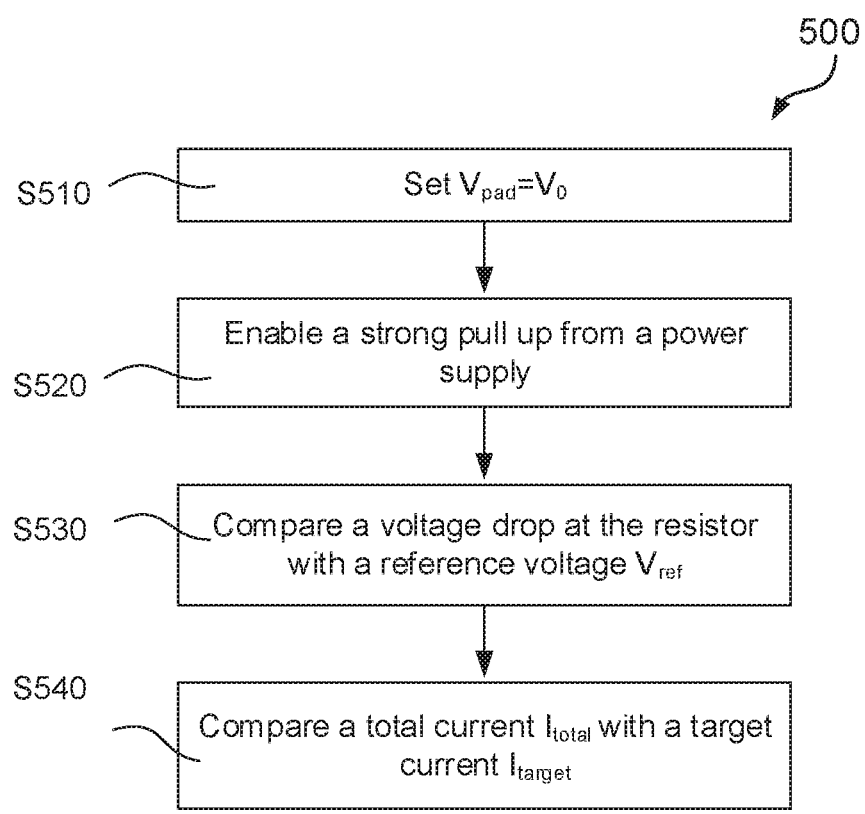
FIG. 5 illustrates a method to check a total current in the peak power circuit of FIG. 3, according to some embodiments of the present disclosure.

An exemplary method 500 is described in FIG. 5 to check the total current $I_{total}$, according to some embodiments of the present disclosure. It should be understood that the method 500 for checking the total current $I_{total}$ is not exhaustive and that other operation steps can be performed as well before, after, or between any of the illustrated operation steps. In some embodiments, some operation steps of the method 500 can be omitted or other operation steps can be included, which are not described here for simplicity. In some embodiments, operation steps of the method 500 can be performed in a different order and/or vary.

Referring to FIGS. 3 and 5, the method 500 for checking the total current $I_{total}$ starts at operation step S510, where the gate terminal 334 of the third transistor 332 can be applied with a voltage such that the potential $V_{pad}$ of the contact pad 204 can be clamped to the pre-given potential $V_0$. In some embodiments, the voltage applied to the gate terminal 334 can be approximate to the pre-given potential $V_0$.

At operation step S520, the first transistor 310 can be strongly turned on (i.e., operate in the saturation mode) such that the high level of current $I_H$ can flow through the first transistor 310 from the first power source $V_{dd1}$. After the second current path 346 is enabled, the potential at the node 318 can be strongly pulled up to the voltage of the first power source $V_{dd1}$ 306. Because the resistor 320 is arranged in serial with the contact pad 204, the total current $I_{total}$ is about the same as the current flowing through the contact pad 204.

At operations step S530, a voltage drop $\Delta V$ across the resistor 320 can be determined at the amplifier 328. The reference voltage $V_{ref}$ of the amplifier 328 can be preset to the voltage of the first power source $V_{dd1}$ subtract an expected voltage drop $\Delta V_{exp}$ at the resistor 320, i.e., $V_{ref} = V_{dd1} - \Delta V_{exp}$, where a potential of the node 322 can be the input voltage $V_{in}$ at the second input terminal 326 of the amplifier 328.

At operation step S540, the total current $I_{total}$ can be compared with a target current $I_{target}$. For a resistor 320 with resistance of R, a target current $I_{target}$ can be expressed in terms of the expected voltage drop $\Delta V_{exp}$, i.e., $I_{target} = \Delta V_{exp}/R$. If the output terminal 330 of the amplifier 328 shows that $V_{in} > V_{ref}$, then an actual voltage drop $\Delta V_{act}$ at the resistor 320 is less than the expected voltage drop $\Delta V_{exp}$, i.e., $\Delta V_{act} < \Delta V_{exp}$. Thus, the total current $I_{total}$ is less than the target current $I_{target}$. Conversely, if the output terminal 330 of the amplifier 328 shows that $V_{in} < V_{ref}$, then the total current $I_{total}$ is higher than the target current $I_{target}$. In one example, the expected voltage drop $\Delta V_{exp}$ can be 0.4 V. In this example, if the resistance R of the resistor 320 is about 5K ohm, the target current $I_{target}$ can be 80 µA.

Following the operation steps in the method 500, the total current $I_{total}$ can be detected and compared with the target current $I_{target}$.

Referring back to FIG. 4, at operation step S470, the total current $I_{total}$ can be compared with a maximum current $I_{max}$ subtract the estimated peak power current $I_{pp\_need}$. Here, the total current $I_{total}$ and $I_{max} - I_{pp\_need}$ can be compared following the method 500 described above with the target current $I_{target}$ set as $I_{max} - I_{pp\_need}$. In one example, the maximum current $I_{max}$ can be 80 µA, and the estimated peak power current $I_{pp\_need}$ can be 20 µA.

If $I_{total} < I_{max} - I_{pp\_need}$, operation step S420 can be performed. When $I_{total} < I_{max} - I_{pp\_need}$, running the peak power operation with the estimated peak power current $I_{pp\_need}$, the total current $I_{total}$ will not exceed the maximum current $I_{max}$.

If $I_{total} \geq I_{max} - I_{pp\_need}$, operation step S475 can be performed. At operation step S475, the PPM circuit 202 checks a rising edge of the potential $V_{pad}$ of contact pad 204. If the rising edge of the potential $V_{pad}$ is detected or a predetermined maximum time $t_{max}$ has elapsed, operation step S410 can be performed. Otherwise, the PPC routine 400 repeats operation step S475.

When the PPC routine 400 passes the second check point at operation step S430, the potential $V_{pad}$ of contact pad 204 is compared again with the second predetermined voltage $V_2$ at operation step S435, similar to operation step S460.

At operation step S440, the total current $I_{total}$ is checked again, similar to operation step S465. Unlike in operation step S470, at operation step S445, the total current $I_{total}$ can be compared with the maximum current $I_{max}$. Because at operation step S420 the pull-down current $I_{pull\_dn}$ at the current source 340 has been set as the estimated peak power current $I_{pp\_need}$, the total current $I_{total}$ at operation step S440 includes a component of the estimated peak power current $I_{pp\_need}$. In the other words, the total current $I_{total}$ can be larger than the estimated peak power current $I_{pp\_need}$. Similarly, the total current $I_{total}$ and the maximum current $I_{max}$ can be compared following the method 500 in FIG. 5, where the target current $I_{target}$ can be set as the maximum current $I_{max}$.

If at operation step S445 the total current $I_{total}$ is determined to be less than the maximum current $I_{max}$, i.e., $I_{total} < I_{max}$, the peak power operation can be performed by the PPO device 350 at the operation step S450. An actual peak power current $I_{pp}$ can flow through the current source 340, i.e., the pull-down current can be the actual peak power current, i.e., $I_{pull\_dn} = I_{pp}$. The current source 340 can send the control signal 348 based on the actual peak power current $I_{pp}$. After receiving the control signal 348, the PPO device 350 can perform the peak power operation.

At operation step S455, after the peak power operation is completed, the PPM circuit 202 can switch off the first transistor 310 and release the actual peak power current $I_{pp}$. The pull-down current $I_{pull\_dn}$ can be set back to the idle current $I_{idle}$. If no other memory die is running peak power operation, the potential $V_{pad}$ at the contact pad 204 can be driven to a high level (e.g., larger than the first predetermined voltage $V_1$). The PPC routine 400 can return to operation step S405 and the PPM circuit 202 can go back to the reset state.

If at operation step S445, the total current $I_{total}$ is determined no less than the maximum current $I_{max}$, i.e., $I_{total} \geq I_{max}$, operation step S480 can be performed, where the pull-down current $I_{pull\_dn}$ at the current source 340 can be set as the idle current $I_{idle}$.

At operation step S485, similar to operation step S475, the PPM circuit 202 can check if a rising edge of the potential $V_{pad}$ of the contact pad 204 can be detected or not. If the rising edge of the potential $V_{pad}$ is detected or the predetermine maximum time $t_{max}$ is reached, operations step S490 and then operation step S435 can be performed. Otherwise, the PPM circuit 202 repeats the operation step S485. At operation step S490, a second time delay $t_{dl\_2}$ can be added to the PPC routine 400. Here the second time delay $t_{dl\_2}$ can be a short random delay to de-synchronize the memory dies.

It is noted that value of the current, e.g., the maximum current $I_{max}$, the estimated peak power current $I_{pp\_need}$, the pull-down current $I_{pull\_dn}$, the idle current $I_{idle}$, etc., can be scaled down values from the actual current supporting peak power operations on the memory die (e.g., performed by the PPO device 350). For example, the maximum current $I_{max}$ of 80 μA for the PPM circuit 202 can correspond to 800 mA maximum current for running the peak power operations on the memory die. Similarly, the estimated peak power current $I_{pp\_need}$ of 20 μA and the idle current $I_{idle}$ of 0.1 μA for the PPM circuit 202 can correspond to an actual value of 200 mA and 1 mA, respectively, for the peak power operations on the memory die.

It is noted that any operation step of PPC routine 400 that involves checking, e.g., operation step S415, S435, S445, S460, S470, S475 or S480, two or more checking steps can be performed in each operation step, where a time delay can be built in between the two or more checking steps to ensure the validity, repeatability of the result.

In summary, the present disclosure provides a peak power management (PPM) circuit on a memory die. The PPM circuit includes a first transistor and a second transistor arranged in parallel, wherein the first and second transistors each has a drain terminal electrically connected to a first power source and a second power source, respectively. The PPM circuit also includes a resistor having a first terminal electrically connected to respective source terminals of the first and second transistors. The PPM circuit further includes a first contact pad on the memory die, electrically connected to a second contact pad on a different memory die through a die-to-die connection. The PPM circuit also includes a third transistor with a drain terminal electrically connected to a second terminal of the resistor, and a source terminal electrically connected to the first contact pad.

The present disclosure also provides a method of peak power management (PPM) for a memory chip with one or more memory dies, where each of the one or more memory dies includes a peak power management (PPM) circuit. The method of PPM includes performing a first stage of management on a selected memory die in the memory chip, and performing a second stage of management on the selected memory die. Performing the first stage of management includes comparing a potential of a contact pad in the PPM circuit with a first predetermined voltage, wherein the contact pad is electrically connected with a second contact pad of a different memory die. Performing the first stage of management also includes setting a pull-down current of a current source, which is electrically connected to the contact pad in the PPM circuit, to an estimated peak power current corresponding to a peak power operation on the selected memory die when the potential of the contact pad is higher than the first predetermined voltage. Performing the second stage of management includes comparing the potential of the contact pad with a second predetermined voltage lower than the first predetermined voltage, and comparing a total current flowing through a resistor, which is electrically connected to the contact pad in the PPM circuit, with a maximum current allowed on the selected memory die when the potential of the contact pad is lower than the second predetermined voltage. Performing the second stage of management further includes performing the peak power operation on the selected memory die when the total current is less than the maximum current.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A peak power management circuit on a memory die, comprising:
   a first transistor and a second transistor arranged in parallel, wherein the first and second transistors each comprises a drain terminal electrically connected to a first power source and a second power source, respectively;
   a resistor having a first terminal electrically connected to respective source terminals of the first and second transistors;
   a first contact pad on the memory die, electrically connected to a second contact pad on a different memory die through a die-to-die connection; and a third transistor with a drain terminal electrically connected to a second terminal of the resistor, and a source terminal electrically connected to the first contact pad.

2. The peak power management circuit of claim 1, further comprising:
an amplifier with an input terminal electrically connected to the drain terminal of the third transistor.

3. The peak power management circuit of claim 2, wherein the amplifier is a comparator.

4. The peak power management circuit of claim 1, wherein the first and second transistors are p-channel metal oxide semiconductor field effect transistors (MOSFETs).

5. The peak power management circuit of claim 1, wherein the third transistor is an n-channel metal oxide semiconductor field effect transistor (MOSFET).

6. The peak power management circuit of claim 1, further comprising:
a current source configured to control a peak power operation device on the memory die based on a pull-down current flowing through the current source.

7. The peak power management circuit of claim 6, further comprising:
a fourth transistor electrically connected with the current source and the first contact pad.

8. The peak power management circuit of claim 1, wherein the first contact pad is electrically connected to the second contact pad on the different memory die through wire-bonding, the die-to-die connection comprising a metal wire.

9. The peak power management circuit of claim 1, wherein the first contact pad is electrically connected to the second contact pad on the different memory die through flip-chip bonding or die-to-die bonding, the die-to-die connection comprising a metal or conductive material.

10. A method of peak power management (PPM) for a memory chip with one or more memory dies, wherein each of the one or more memory dies comprises a PPM circuit, the method comprising:
performing a first stage of management on a selected memory die in the memory chip, comprising:
comparing a potential of a contact pad in the PPM circuit with a first predetermined voltage, wherein the contact pad is electrically connected with a second contact pad of a different memory die; and
setting a pull-down current of a current source, which is electrically connected to the contact pad in the PPM circuit, to an estimated peak power current corresponding to a peak power operation on the selected memory die when the potential of the contact pad is higher than the first predetermined voltage.

11. The method of claim 10, further comprising:
performing a second stage of management on the selected memory die, comprising:
comparing the potential of the contact pad with a second predetermined voltage lower than the first predetermined voltage;
comparing a total current flowing through a resistor, which is electrically connected to the contact pad in the PPM circuit, with a maximum current allowed on the selected memory die when the potential of the contact pad is lower than the second predetermined voltage; and
performing the peak power operation on the selected memory die when the total current is less than the maximum current.

12. The method of claim 11, further comprising:
adding a time delay between performing the first stage of management and performing the second stage of management, wherein the time delay is different for different memory die.

13. The method of claim 11, wherein performing the second stage of management further comprises:
repeating the comparing of the potential of the contact pad with the second predetermined voltage when the potential of the contact pad is not lower than the second predetermined voltage.

14. The method of claim 11, wherein performing the second stage of management further comprises:
setting the pull-down current of the current source to an idle current when the total current is not less than the maximum current.

15. The method of claim 14, further comprising:
checking a rising edge of the potential of the contact pad; and
repeating the checking of the rising edge of the potential of the contact pad if the rising edge of the potential of the contact pad is not detected or a predetermined maximum time is not reached.

16. The method of claim 15, further comprising:
adding a second time delay when the rising edge of the potential of the contact pad is detected or the predetermined maximum time is reached, wherein the second time delay is different for each of the one or more memory dies.

17. The method of claim 10, wherein performing the first stage of management further comprises:
comparing the potential of the contact pad with the second predetermined voltage when the potential of the contact pad is not higher than the first predetermined voltage.

18. The method of claim 17, further comprising:
comparing the total current with the maximum current subtracting the estimated peak power current if the potential of the contact pad is lower than the second predetermined voltage.

19. The method of claim 17, further comprising:
checking a rising edge of the potential of the contact pad; and
repeating the checking of the rising edge of the potential of the contact pad when the rising edge of the potential of the contact pad is not detected or a predetermined maximum time is not reached.

20. The method of claim 19, further comprising:
comparing the potential of the contact pad with the first predetermined voltage when the rising edge of the potential of the contact pad is detected or the predetermined maximum time is reached.

* * * * *